(12) United States Patent
Cai

(10) Patent No.: US 12,382,659 B2
(45) Date of Patent: Aug. 5, 2025

(54) METHOD FOR MANUFACTURING TRENCH MOSFET

(71) Applicant: Hangzhou Silicon-Magic Semiconductor Technology Co., Ltd., Hangzhou (CN)

(72) Inventor: Jinyong Cai, Hangzhou (CN)

(73) Assignee: Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 408 days.

(21) Appl. No.: 18/183,789

(22) Filed: Mar. 14, 2023

(65) Prior Publication Data
US 2024/0128370 A1 Apr. 18, 2024

(30) Foreign Application Priority Data
Oct. 18, 2022 (CN) .......................... 202211271251.4

(51) Int. Cl.
*H10D 30/66* (2025.01)
*H10D 30/01* (2025.01)
*H10D 64/27* (2025.01)

(52) U.S. Cl.
CPC ....... *H10D 30/668* (2025.01); *H10D 30/0297* (2025.01); *H10D 64/513* (2025.01)

(58) Field of Classification Search
None
See application file for complete search history.

(56) References Cited
U.S. PATENT DOCUMENTS
2007/0170498 A1* 7/2007 Hu ...................... H10D 30/0297
257/330

* cited by examiner

*Primary Examiner* — Jack S Chen
(74) *Attorney, Agent, or Firm* — OSHA BERGMAN WATANABE & BURTON LLP

(57) ABSTRACT

A method for manufacturing a trench MOSFET includes: forming a trench extending from an upper surface of an epitaxial layer of a first dopant type into the epitaxial layer; forming a gate dielectric layer and a gate conductor located in the trench; forming a body region of a second dopant type located in the epitaxial layer, where the body region is adjacent to the trench; forming a source region of the first dopant type located in the body region; forming a first dielectric layer on the source region and the gate dielectric layer; forming a contact hole extending through the first dielectric layer and the source region and extending into the body region; forming a spacer on a side wall of the contact hole; forming a body contact region of the second dopant type through the contact hole; and forming a conductive channel filling the contact hole.

10 Claims, 15 Drawing Sheets

US 12,382,659 B2

METHOD FOR MANUFACTURING TRENCH MOSFET

TECHNICAL FIELD

This application relates to the technical field of semiconductors, and in particular, to a method for manufacturing a trench metal oxide semiconductor field effect transistor (MOSFET).

BACKGROUND

A trench metal oxide semiconductor field effect transistor (MOSFET) device is widely used in the field of power electronics due to advantages such as a high input impedance, a small driving current, a fast switching speed, and high temperature characteristics.

In a general trench MOSFET device, an on resistance of the device is reduced by continuously reducing a size of the device, and the reduction of the size of the device leads to a corresponding decrease in a size of a body region. Therefore, a contact region formed in the body region laterally intrudes into a trench region adjacent to the trench, and the performance of the device is affected.

SUMMARY

The present application provides a method for manufacturing a trench MOSFET. A contact hole is formed before a contact region is formed, and a spacer is formed in the contact hole. The spacer of a side wall of the contact hole can prevent the contact region from laterally invading a trench region, thereby ensuring the reliability of performance of a device.

The present application provides a method for manufacturing a trench MOSFET, including:
  forming a trench extending from an upper surface of an epitaxial layer of a first dopant type into the epitaxial layer;
  forming a gate dielectric layer and a gate conductor located in the trench, where the gate dielectric layer covers an inner surface of the trench and isolates the gate conductor from the epitaxial layer;
  forming a body region of a second dopant type located in the epitaxial layer, where the body region is adjacent to the trench;
  forming a source region of the first dopant type located in the body region;
  forming a first dielectric layer on the source region and the gate dielectric layer;
  forming a contact hole extending through the first dielectric layer and the source region and extending into the body region;
  forming a spacer on a side wall of the contact hole;
  forming a body contact region of the second dopant type through the contact hole; and
  forming a conductive channel filling the contact hole.

BRIEF DESCRIPTION OF THE DRAWINGS

The foregoing and other objects, features, and advantages of the present application will become more apparent from the following description of embodiments with reference to the accompanying drawings.

DETAILED DESCRIPTION

Figure 1:
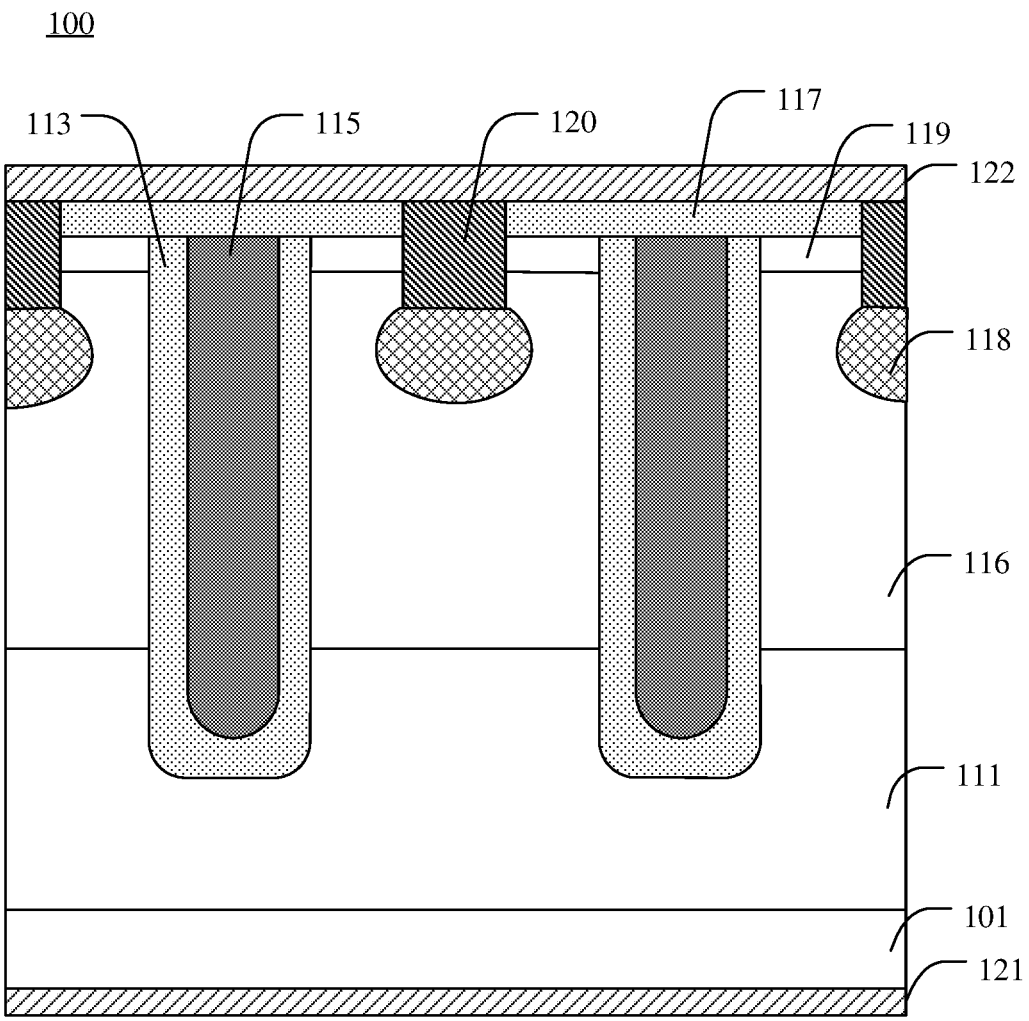
FIG. 1 shows a sectional view of a trench MOSFET.

In each of the following accompanying drawings, same elements are represented by using similar reference numerals. For clarity, each part in the accompanying drawings is not drawn to scale. In addition, certain known parts may not be shown. For brevity, a semiconductor structure obtained after a plurality of steps may be described in a figure.

In describing the structure of a device, when a layer or a region is located "above" or "over" another layer or another region, it may mean that the layer or the region is directly located above another layer or another region, or other layers or regions are further included between the layer or the region and another layer or another region. In addition, if the device is turned over, the layer or the region is located "below" or "under" the another layer or the another region.

For describing the situation of being directly above the another layer or the another region, expressions of "directly above . . . " or "above and adjacent to . . . " are to be used herein.

Unless otherwise specified below, each part of the semiconductor device may be made of materials well known to those skilled in the art. Semiconductor materials include, for example, group III-V semiconductors such as gallium arsenide (GaAs) and gallium nitride (GaN), group IV-IV semiconductors such as silicon carbide (SiC), group II-VI compound semiconductors such as cadmium sulfide (CdS) and cadmium telluride (CdTe), and group IV semiconductors such as silicon (Si) and germanium (Ge). A gate conductor may be formed by various materials that can conduct electricity, for example, a metal layer, a doped polysilicon layer, or a laminated gate conductor including a metal layer and a doped polysilicon layer, or other conductive materials, for example, TaC, TiN, TaSiN, HfSiN, TiSiN, TiCN, TaAlC, TiAlN, TaN, PtSix, $Ni_3Si$, Pt, Ru, W, and a combination of various conductive materials. A gate dielectric may be made of $SiO_2$ or a material having a dielectric constant greater than $SiO_2$, including, for example, an oxide, a nitride, a nitrogen oxide, silicate, aluminate, and titanate. Moreover, the gate dielectric may be formed not only by the material known to those skilled in the art, but also by the material developed for the gate dielectric in the future.

FIG. 1 shows a sectional view of a trench MOSFET according to one or more embodiments of the present application. In the present application, a first dopant type is one of an N type or a P type, and a second dopant type is the other of the N type and the P type. An N-type semiconductor layer may be formed by implanting an N-type dopant, such as P and As, into a semiconductor layer. A P-type semiconductor layer may be formed by doping a P-type dopant, such as B, into the semiconductor layer.

A trench MOSFET 100 includes a substrate 101 and an epitaxial layer 111 located on the substrate 101. The substrate 101, as a drain region of the trench MOSFET 100, has the first dopant type, which, in one or more embodiments, is heavy N-type dopant. The epitaxial layer 111 is located on a first surface of the substrate 101, and the epitaxial layer 111 is lightly doped relative to the substrate 101.

The trench MOSFET 100 includes: a trench 112 located in the epitaxial layer 111, a gate dielectric layer 113 and a gate conductor 115 located inside the trench 112; and a body region 116 located in the epitaxial layer 111 and adjacent to the trench 112, where the body region 116 is of the second dopant type. The trench 112 extends from an upper surface of the epitaxial layer 111 into the epitaxial layer 111, and ends in the epitaxial layer 111. The gate dielectric layer 113 covers a bottom and a side wall of the trench 112, and the gate conductor 115 is located in a cavity formed by the gate dielectric layer 113 around the trench 112 and is isolated from the epitaxial layer 111 by the gate dielectric layer 113.

The trench MOSFET 100 further includes: a source region 119 of the first dopant type formed in the body region 116; a contact region 118 of the second dopant type formed in the body region 116; a dielectric layer 117 formed on the source region 119 and the gate conductor 115; and a conductive channel 120 formed immediately adjacent to the source region 119, which penetrates the dielectric layer 117 and the source region 119 to reach the contact region 118. The dielectric layer 117 may be an oxide layer having a certain thickness, for example, silicon oxide.

The trench MOSFET 100 further includes a drain electrode 121 and a source electrode 122. The drain electrode 121 is located on a second surface of the substrate 101 and is electrically connected to the substrate 101. The source electrode 122 is located on the dielectric layer 117 and is connected to the contact region 118 through the conductive channel 120. The second surface of the substrate 101 is opposite to the first surface of the substrate 101.

FIG. 2A to FIG. 2K show sectional views of stages of a method for manufacturing a trench MOSFET device according to one or more embodiments of the present application. The method for manufacturing a trench MOSFET device provided in one or more embodiments of the present application is described below with reference to FIG. 2A to FIG. 2G.

Figure 2A:
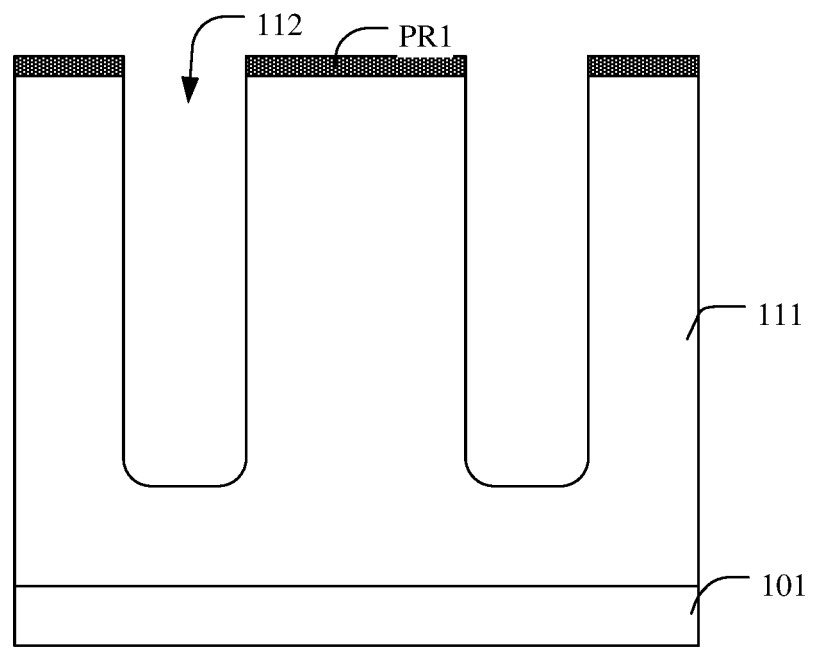
FIG. 2A to FIG. 2K show sectional views of stages of a method for manufacturing a trench MOSFET device according to one or more embodiments of the present application.

As shown in FIG. 2A, an epitaxial layer 111 is formed on a substrate 101, and a trench 112 is formed in the epitaxial layer 111.

In the step, the epitaxial layer 111 is formed on a first surface of the substrate 101, and the substrate 101 serves as a drain region of the device and has a first dopant type. In one or more embodiments, a material of the substrate 101 may be an N-type monocrystalline silicon substrate.

A patterned first mask PR1 is formed on an upper surface of the epitaxial layer 111, and the trench 112 is formed in the epitaxial layer 111 through the first mask PR1.

In the step, for example, a first mask PR1 is formed by using a deposition process, the patterned first mask PR1 is formed by photolithography, and the epitaxial layer 111 is then etched through the patterned first mask PR1 to form the trench 112 in the epitaxial layer 111. In one or more embodiments, the etching may be dry etching, such as ion milling etching, plasma etching, reactive ion etching, laser ablation, or wet etching. In one or more embodiments, the first mask PR1 may be a photoresist mask, and the first mask PR1 is removed after the trench 112 is formed.

Figure 2B:
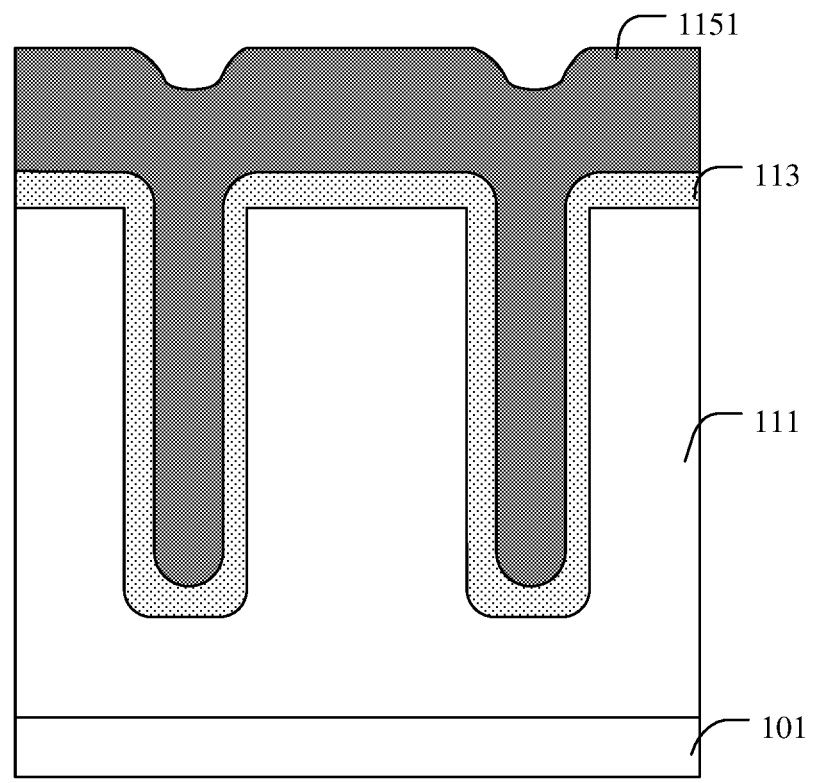

As shown in FIG. 2B, a gate dielectric layer 113 and a polysilicon layer 1151 are successively formed in the trench 112.

In one or more embodiments, the gate dielectric layer 113 is formed inside the trench 112 and on the upper surface of the epitaxial layer 111 by thermal oxidation or chemical vapor deposition (CVD). That is to say, the gate dielectric layer 113 covers a bottom and a side wall of the trench 112 and the upper surface of the epitaxial layer 111. In one or more embodiments, the gate dielectric layer 113 may be composed of an oxide or a nitride, for example, silicon oxide or silicon nitride. The thermal oxidation includes hydrothermal oxidation (HTO) or selective reactive oxidation (SRO). The CVD includes low pressure CVD (LPCVD) or sub-atmospheric CVD (SACVD).

The polysilicon layer 1151 is formed inside the trench 112 and on the surface of the gate dielectric layer 113 on the epitaxial layer 111 through the low pressure CVD. The gate dielectric layer 113 isolates the polysilicon layer 1151 from the epitaxial layer 111.

Figure 2C:
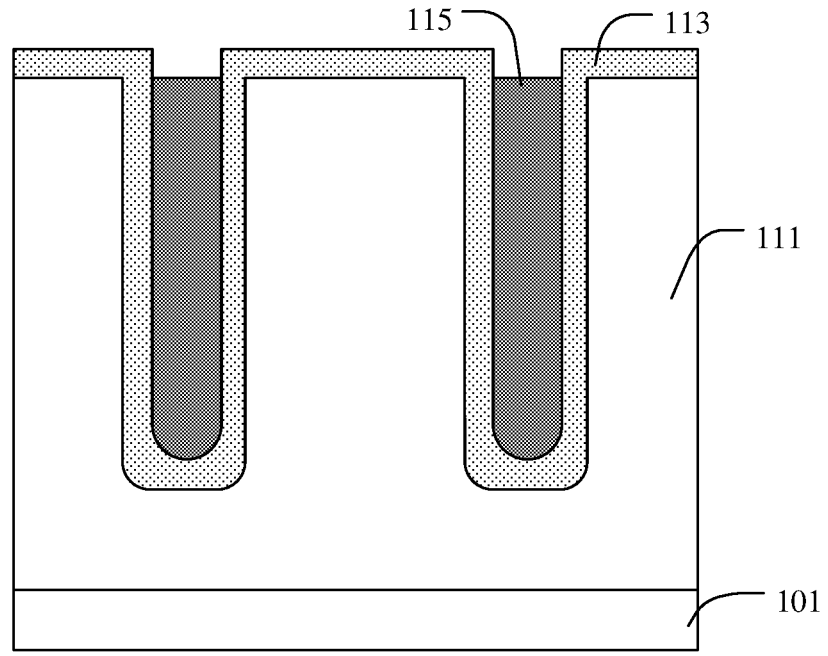

As shown in FIG. 2C, the polysilicon layer 1151 is etched back to form a gate conductor 115.

In the step, the back etching is performed to remove a part of the polysilicon layer 1151 located on the epitaxial layer 111, so that an upper end of the polysilicon layer 1151 ends at an opening of the trench 112, and an upper surface of the polysilicon layer 1151 is flush with the upper surface of the epitaxial layer 111 to form the gate conductor 115.

In other embodiments, a chemical-mechanical planarization process may further be used for removing the part of the polysilicon layer 1151 located on the epitaxial layer 111, so that the upper end of the polysilicon layer 1151 ends at the opening of the trench 112, and the upper surface of the polysilicon layer 1151 is flush with the upper surface of the epitaxial layer 111 to form the gate conductor 115. In this case, the gate dielectric layer 113 located on the epitaxial layer 111 is also removed. After the forming the gate conductor 115, the method further includes growing an oxide layer on the surface of the epitaxial layer 111 as a barrier layer in a subsequent process of forming a body region 116 and a source region 119.

Figure 2D:
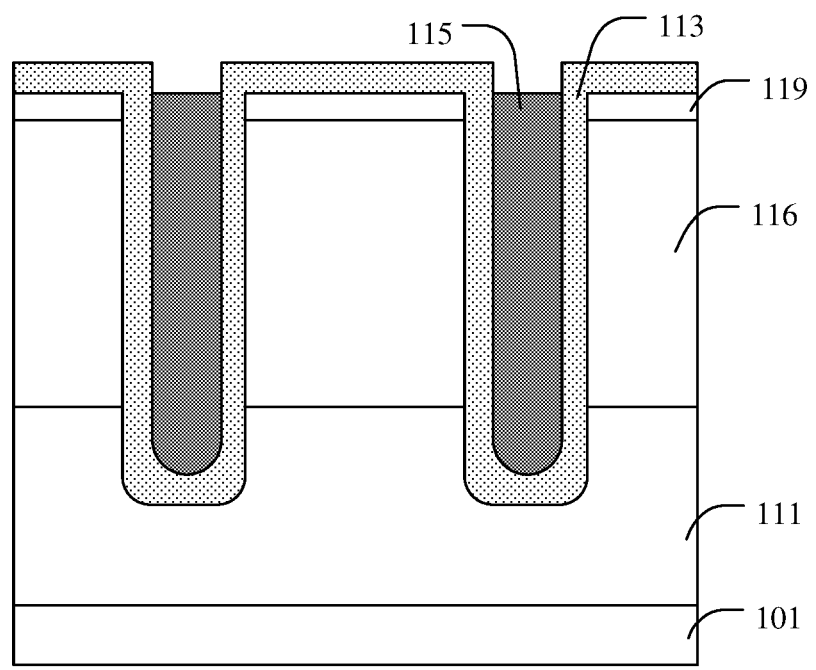

As shown in FIG. 2D, the body region 116 and the source region 119 are formed in a region of the epitaxial layer 111 adjacent to the trench 112.

The body region 116 is of the second dopant type, where the second dopant type is opposite to the first dopant type. The photoresist mask is used to define a region of the body region 116, and a first ion implantation is performed in the region defined by the photoresist mask to form the body region 116 in the epitaxial layer 111 close to the trench 112. After the body region 116 is formed, the photoresist mask is removed. The photoresist mask is used to define a region of the source region 119, and a second ion implantation is performed in the region defined by the photoresist mask to form the source region 119 of the first dopant type in the body region 116. By controlling parameters for the ion implantation, for example, the implantation energy and dosage, a desired depth and a desired doping concentration may be obtained. A depth of the body region 116 does not exceed an extending depth of the gate conductor 115 in the trench 112. The body region 116 and the source region 119 are respectively adjacent to the trench 112, and are isolated from the gate conductor 115 by the gate dielectric layer 113.

Figure 2E:
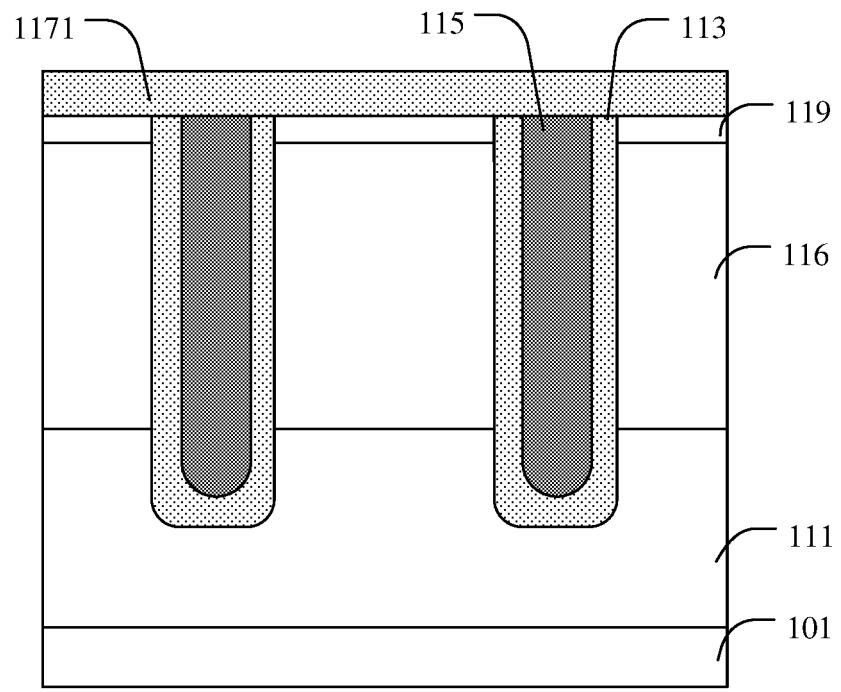

As shown in FIG. 2E, a first dielectric layer 1171 is formed on the source region 119 and on the gate dielectric layer 113.

In the step, the first dielectric layer 1171 located on the source region 119 is formed through the deposition process, and the chemical-mechanical planarization is further performed to obtain a flat surface. The first dielectric layer 1171 covers top surfaces of the source region 119 and the gate conductor 115.

A part of the gate dielectric layer 113 located on the upper surface of the epitaxial layer 111 may or may not be removed by etching after the source region 119 is formed, and is conformal with the first dielectric layer 1171 and located on the source region 119. The first dielectric layer 1171 is, for example, an oxide layer.

Figure 2F:
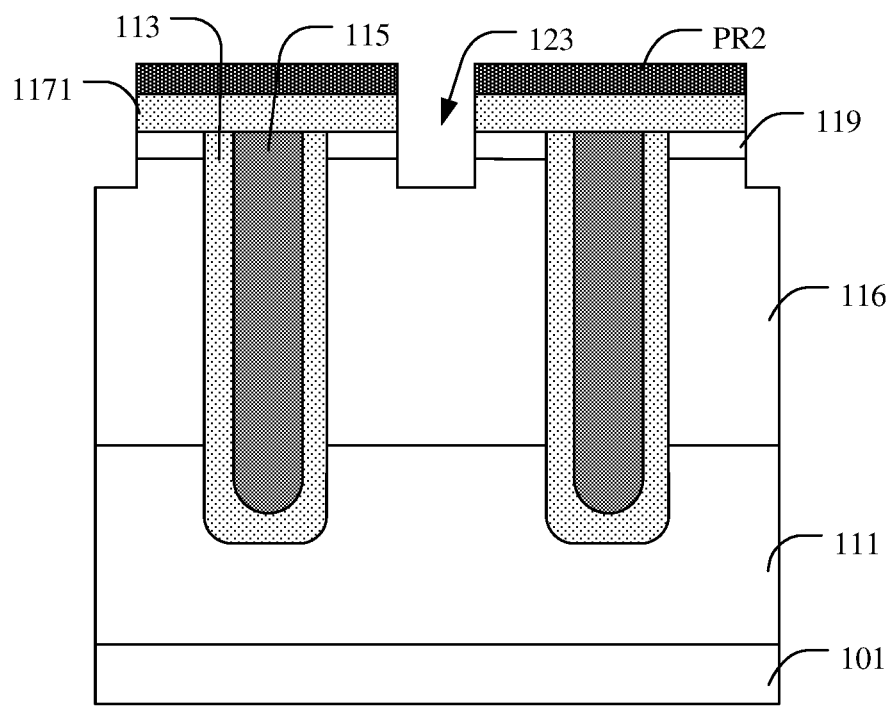

As shown in FIG. 2F, a contact hole 123 extending through the first dielectric layer 1171 and the source region 119 to the inside of the body region 116 is formed.

In the step, for example, a second mask PR2 is formed on the first dielectric layer 1171 by using a deposition process, a patterned second mask PR2 is formed by photolithography, and then the source region 119 and the body region 116 are etched through the patterned second mask PR2 to form the contact hole 123. The contact hole 123 extends from the upper surface of the first dielectric layer 1171 toward the substrate 101, extends through the first dielectric layer 1171 and the source region 119, and stops inside the body region 116. In one or more embodiments, the etching may be dry etching, such as ion milling etching, plasma etching, reactive ion etching, laser ablation, or wet etching. In one or more embodiments, the second mask PR2 may be a photoresist mask, and the second mask PR2 is removed after the contact hole 123 is formed.

Figure 2G:
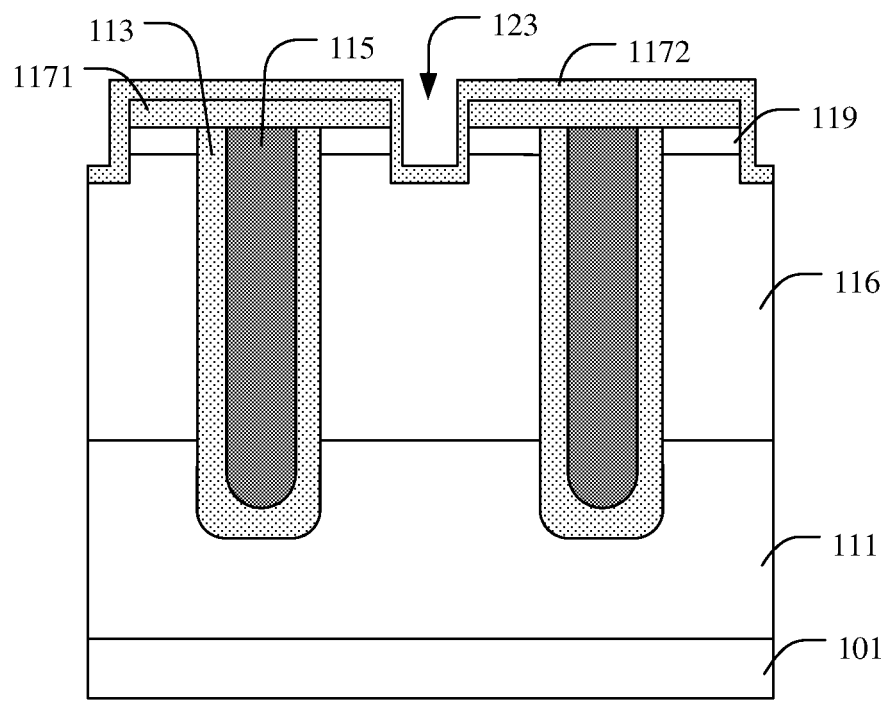

As shown in FIG. 2G, a second dielectric layer 1172 is formed.

In the step, the second dielectric layer 1172 is formed by using the deposition process. The second dielectric layer 1172 covers a surface of the first dielectric layer 1171 and a bottom and a side wall of the contact hole 123. In one or more embodiments, the second dielectric layer 1172 adopts, for example, the same oxide layer as the first dielectric layer 1171.

Figure 2H:
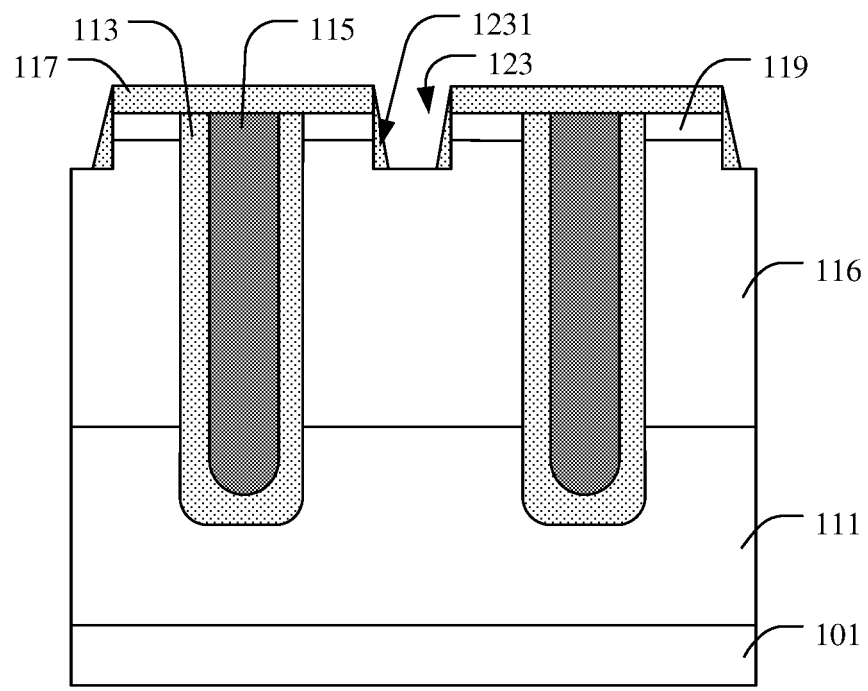

As shown in FIG. 2H, the second dielectric layer 1172 is etched to form a spacer 1231 in the contact hole 123.

In the step, the second dielectric layer 1172 is etched through the etching process. By controlling the parameters for etching, for example, etching energy, an etching angle, and an etching time, at least part of the second dielectric layer 1172 covering the side wall of the contact hole 123 is retained when the etching of the second dielectric layer 1172 covering the bottom of the contact hole 123 is completed during the etching of the second dielectric layer 1172 to form the spacer 1231. In addition, the spacer 1231 has an inclined side wall. An end of the spacer 1231 close to the bottom of the contact hole 123 is thicker than an end of the spacer 1231 close to an opening of the contact hole 123, and the thickness of the side wall gradually decreases. An inclined side wall is presented in a direction from the bottom toward the opening of the contact hole 123.

When the etching of the second dielectric layer 1172 covering the bottom of the contact hole 123 is completed, the second dielectric layer 1172 on the surface of the first dielectric layer 1171 outside the contact hole 123 and a part of the first dielectric layer 1171 are removed, and the rest of the first dielectric layer 1171 is used as a dielectric layer 117. Alternatively, the second dielectric layer 1172 on the surface of the first dielectric layer 1171 outside the contact hole 123 is partially retained and used as the dielectric layer 117 together with the first dielectric layer 1171.

Figure 2I:
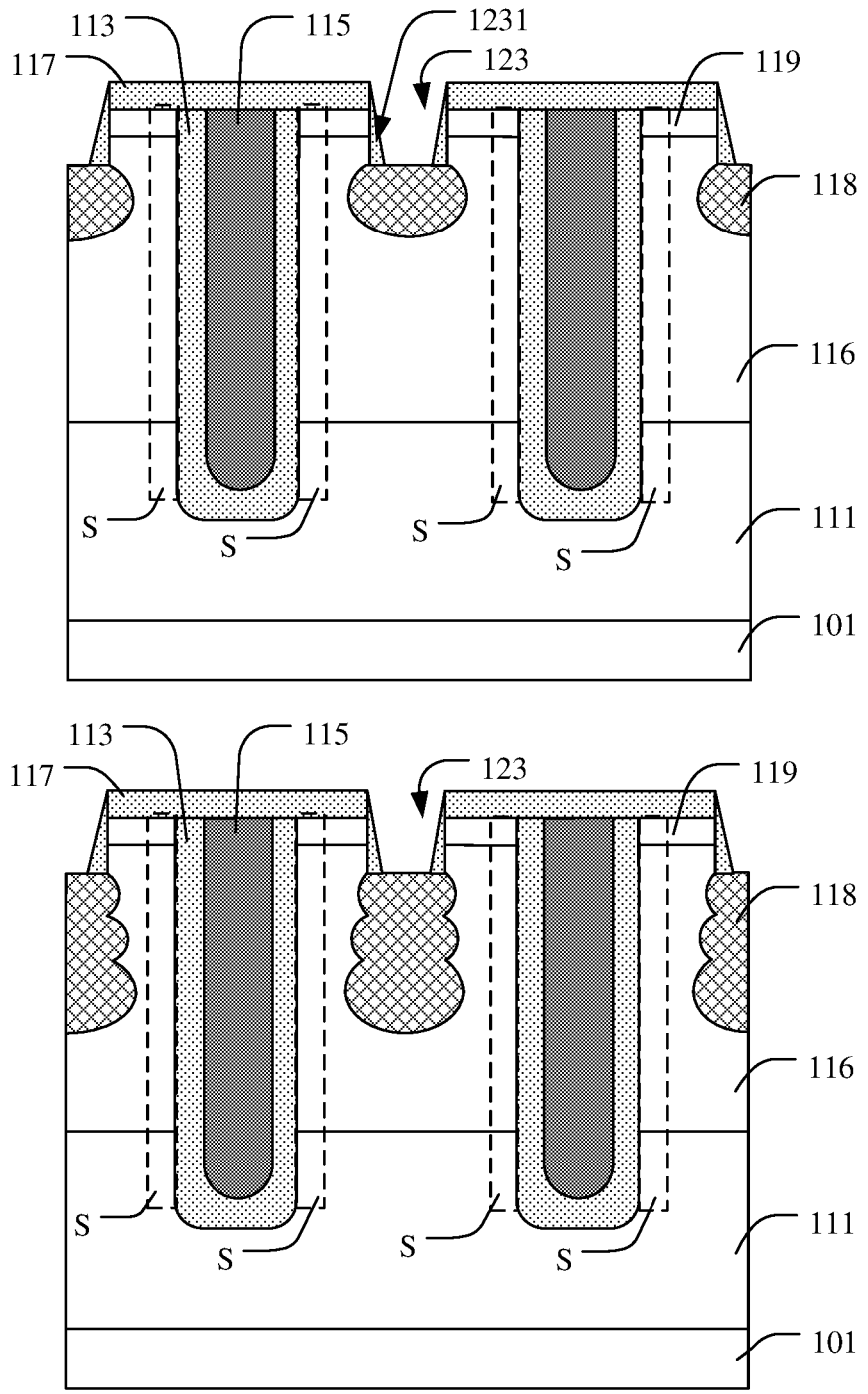

As shown in FIG. 2I, a contact region 118 of the second dopant type is formed in the body region 116.

In the step, a single ion implantation is performed on the body region 116 through the contact hole 123 to form the contact region 118 of the second dopant type in the body region 116, as shown in FIG. 2I (upper). During the ion implantation, the spacer 1231 located on the side wall of the contact hole 123 blocks lateral implantation of ions, so that the implanted ions mainly extend in a depth direction perpendicular to the contact hole 123 to prevent the formed contact region 118 from laterally intruding into a trench region S adjacent to the trench 112.

In one or more embodiments, the contact hole 123 is first formed, and then the spacer 1231 is formed on the side wall of the contact hole 123, so as to block lateral extension of the implanted ions, and prevent the formed contact region 118 from laterally intruding into the trench region S adjacent to the trench 112, thereby ensuring the reliability of the performance of the device. In addition, the lateral intrusion of the contact region 118 is controlled, so that a size of the body region 116 is further reduced, thereby further reduce a size of the whole device or increase a density of the device per unit area.

Further, in one or more embodiments, since the contact hole 123 extends into the body region 116, the ions can be directly implanted into the body region 116 during the formation of the contact region 118 by performing the ion implantation through the contact hole 123. Compared with the ion implantation performed from the upper surface of the source region 119, one or more embodiments disclosed herein provide a method that shortens the time of the ion implantation.

As shown in FIG. 2I (lower), in one or more embodiments, a plurality of ion implantations may be further performed on the body region 116 through the contact hole 123, to form the contact region 118 of the second dopant type in the body region 116. When the plurality of ion implantations are performed on the body region 116 through the contact hole 123, a desired depth and a desired doping concentration for each ion implantation may be obtained by controlling the parameters for the each ion implantation, for example, the implantation energy and dosage. In one or more embodiments, the implantation energy for the plurality of ion implantations may be successively decreased. For example, three ion implantations are performed on the body region 116 through the contact hole 123. The implantation energy for the first ion implantation is the highest, the implantation energy for the second ion implantation is the second highest, and the implantation energy for the third ion implantation is the lowest.

A parasitic resistance formed by the N-type substrate 101, the P-type body region 116, and the N-type source region 119 limits the UIS performance of the device. In general, depths of the contact hole 123 and the conductive channel 120 are usually increased to reduce the parasitic resistance between the P-type body region 116 and the N-type source region 119. However, it is difficult to perform deep-hole etching, and a hole is easily formed in the conductive channel 120 in a process that a metal is deposited in the deep hole to form the conductive channel 120, which affects the conductivity and reliability of the device. In one or more embodiments, the plurality of ion implantations may be performed to further increase a depth of the contact region 118 in a longitudinal direction while ensuring that the contact region 118 does not invade into the trench S region, thereby reducing the parasitic resistance of the N-type substrate 101, the P-type body region 116, and the N-type source region 119, and improving the UIS capability of the device. Compared with the reduction of the parasitic resistance of the N-type substrate 101, the P-type body region 116, and the N-type source region 119 by increasing the depth of the contact hole 123, one or more embodiments disclosed herein provides a method that can simplify the manufacturing process flow of the device, and the formed device has higher reliability.

Figure 2J:
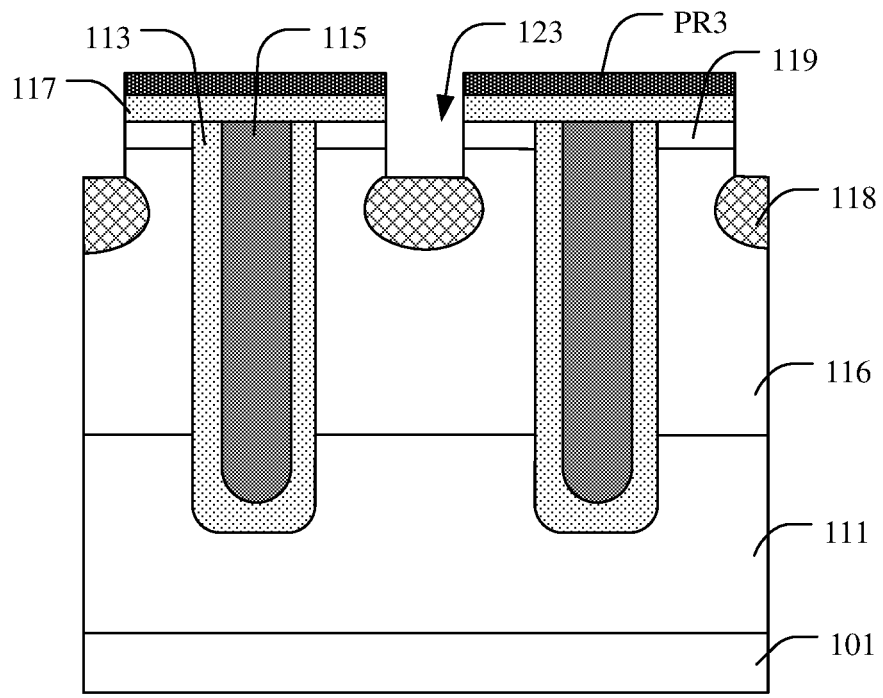

As shown in FIG. 2J, the spacer 1231 is removed.

In the step, for example, the spacer 1231 is removed by wet etching.

Figure 2K:
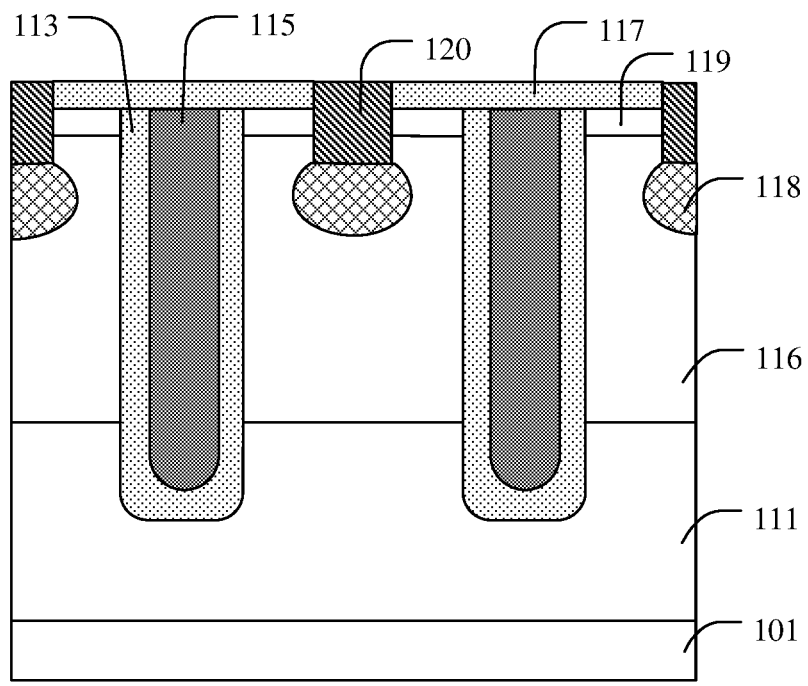

As shown in FIG. 2K, the conductive channel 120 is formed.

In the step, a metal layer is formed by using the deposition process. The metal layer covers the dielectric layer and fills the contact hole 123, and contacts the contact region 118. Then the metal layer on the dielectric layer 117 is removed through back etching or the chemical-mechanical planarization, so that the metal layer only fills the contact hole 123 to form the conductive channel 120. The conductive channel 120 extends to the contact region 118.

A source electrode 122 is formed on the dielectric layer 117 by using the deposition process, the photolithography process, and the etching process. The source electrode 122 is connected to the contact region 118 through the conductive channel 120, and a drain electrode 121 is formed on the second surface of the substrate 101 by using the deposition process, as shown in FIG. 1.

In the present application, the source electrode 122, the gate conductor 115, and the drain electrode 121 may be made of a conductive material. In one or more embodiments, the conductive material may be a metallic material such as an aluminum alloy or copper.

Figure 3A:
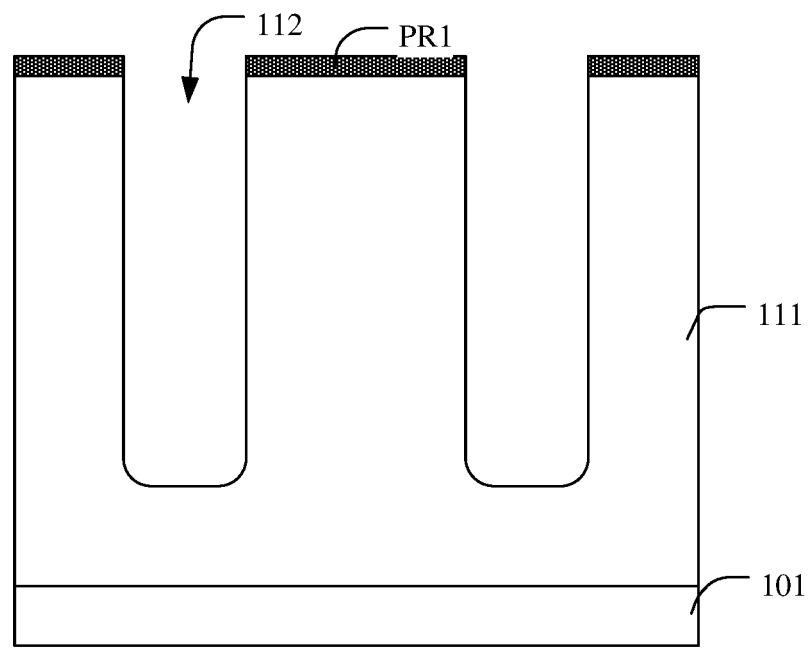
FIG. 3A to FIG. 3O show sectional views of stages of a method for manufacturing a trench MOSFET device according to one or more embodiments of the present application.
Figure 3B:
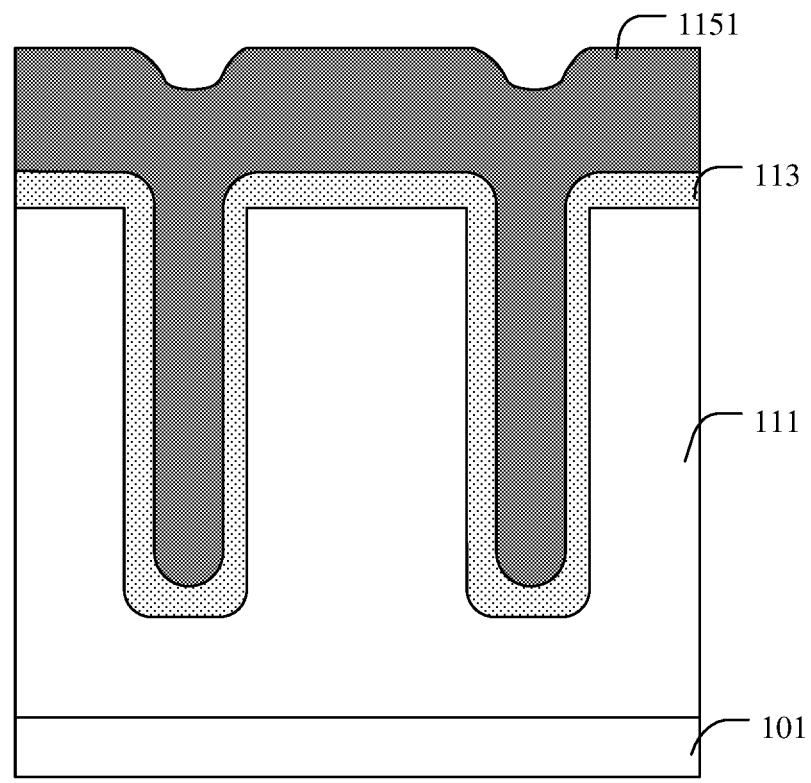
Figure 3C:
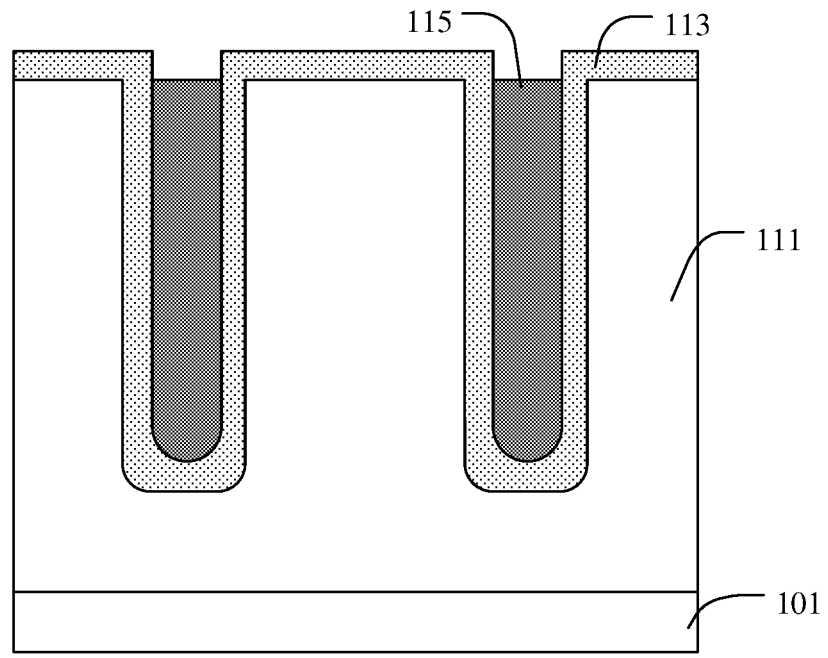
Figure 3D:
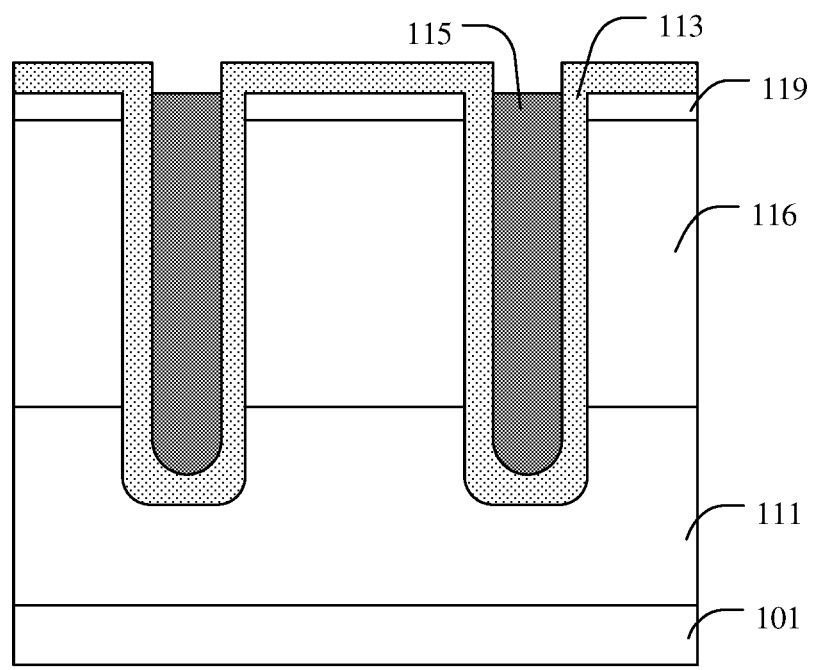
Figure 3E:
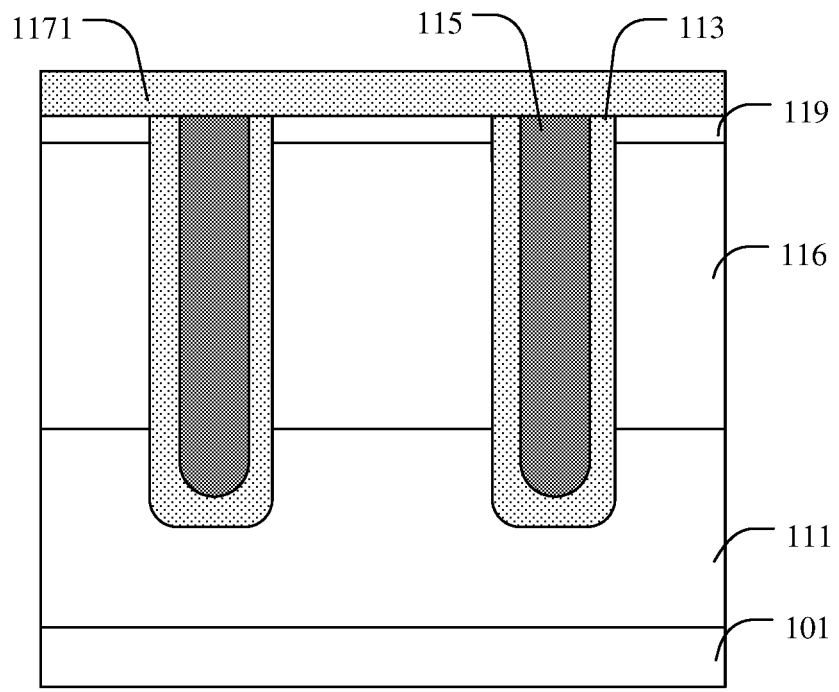
Figure 3F:
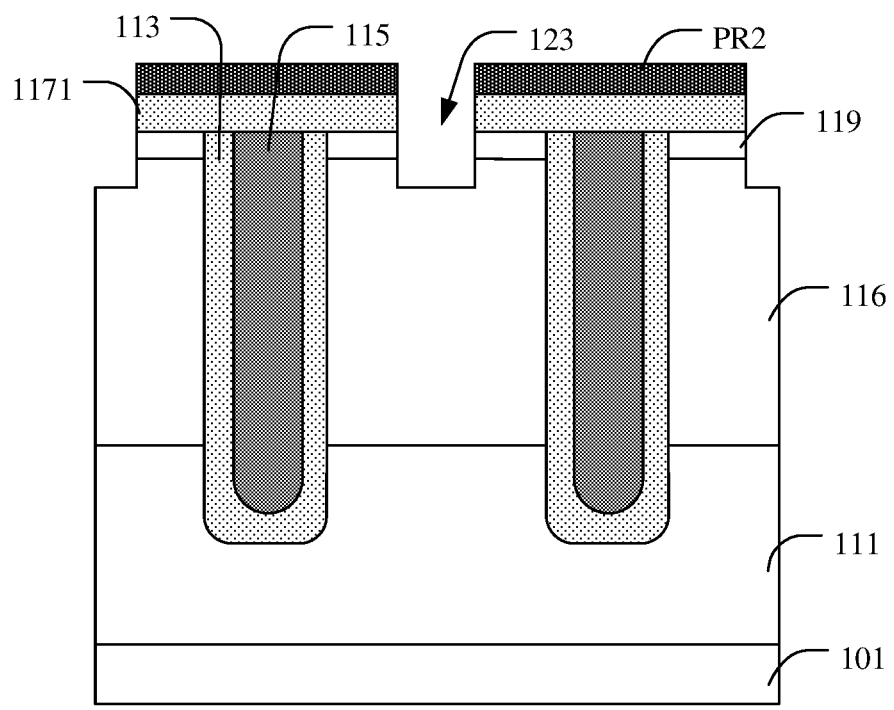
Figure 3G:
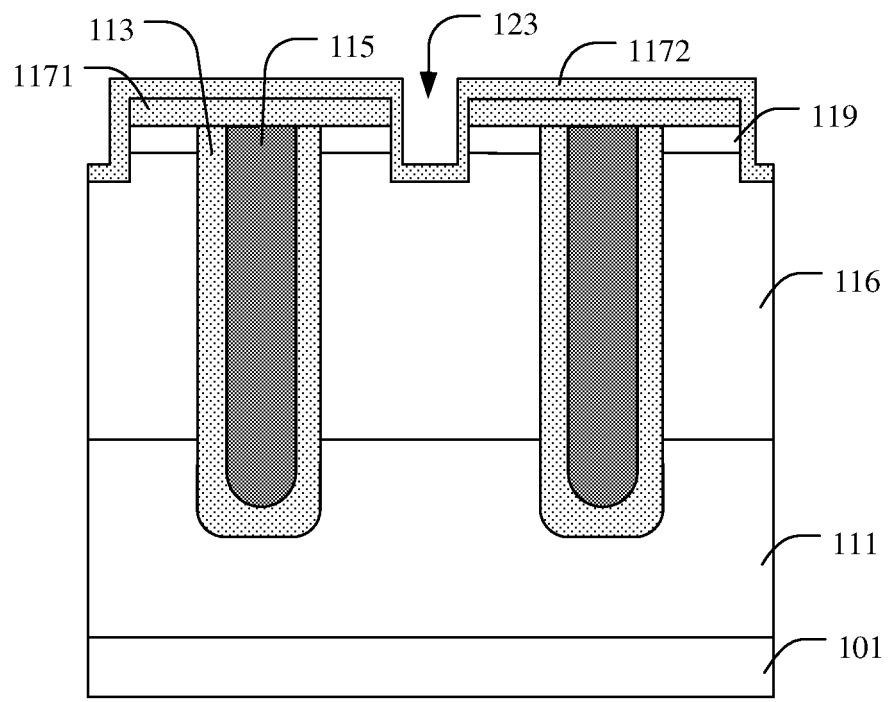
Figure 3H:
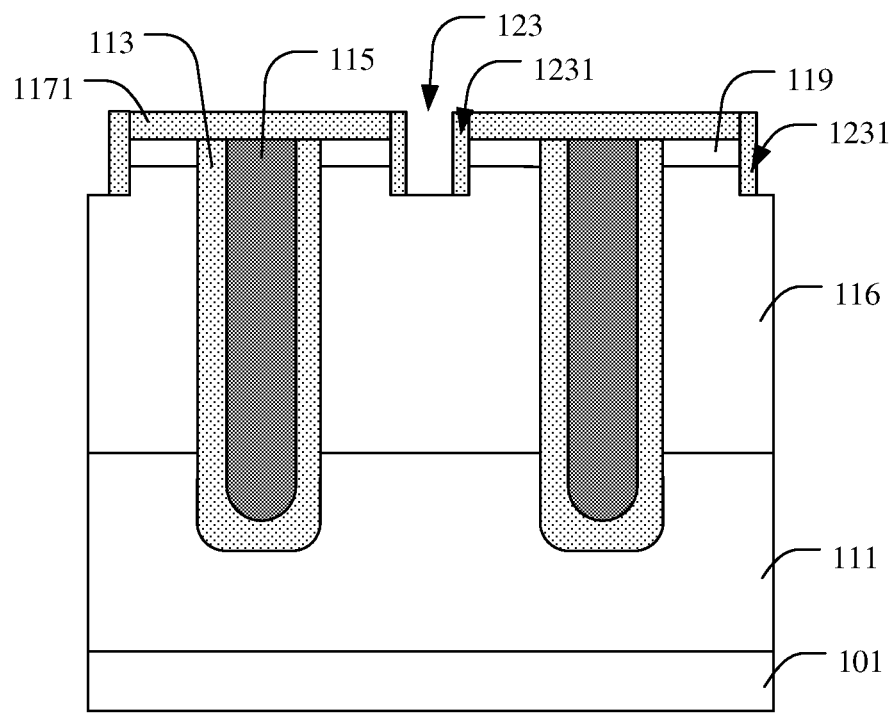
Figure 3I:
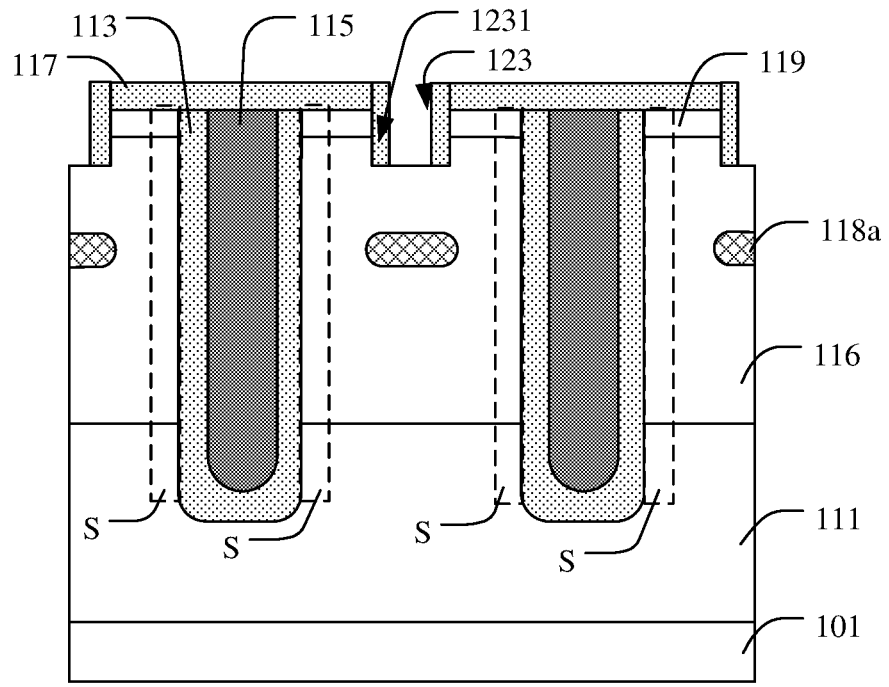
Figure 3J:
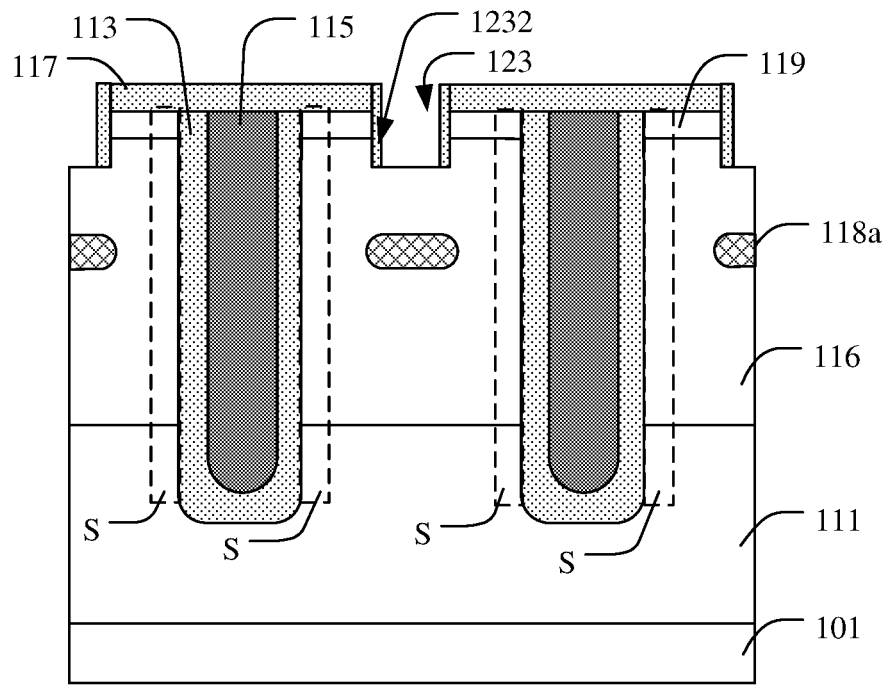
Figure 3K:
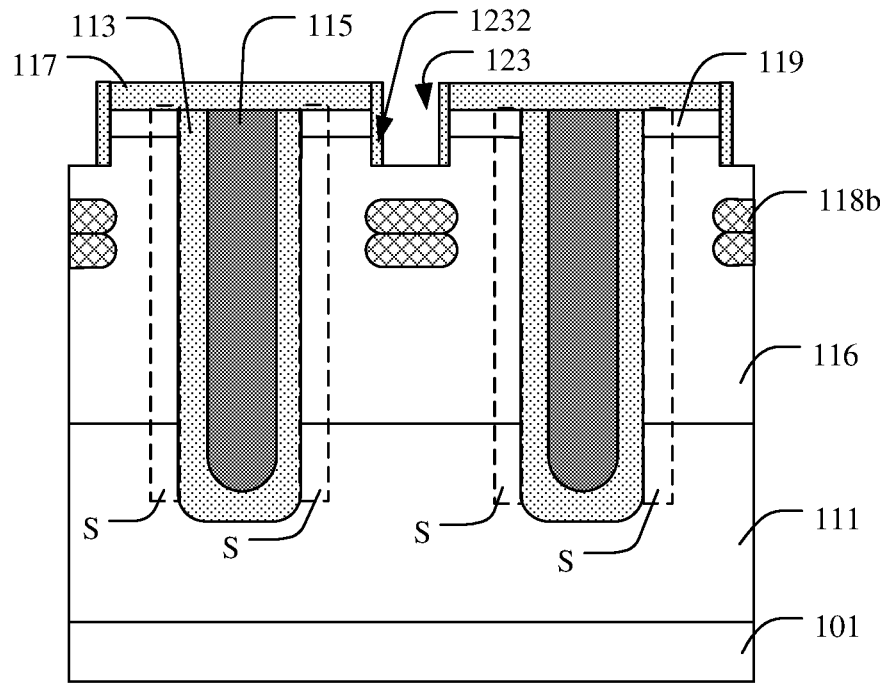
Figure 3L:
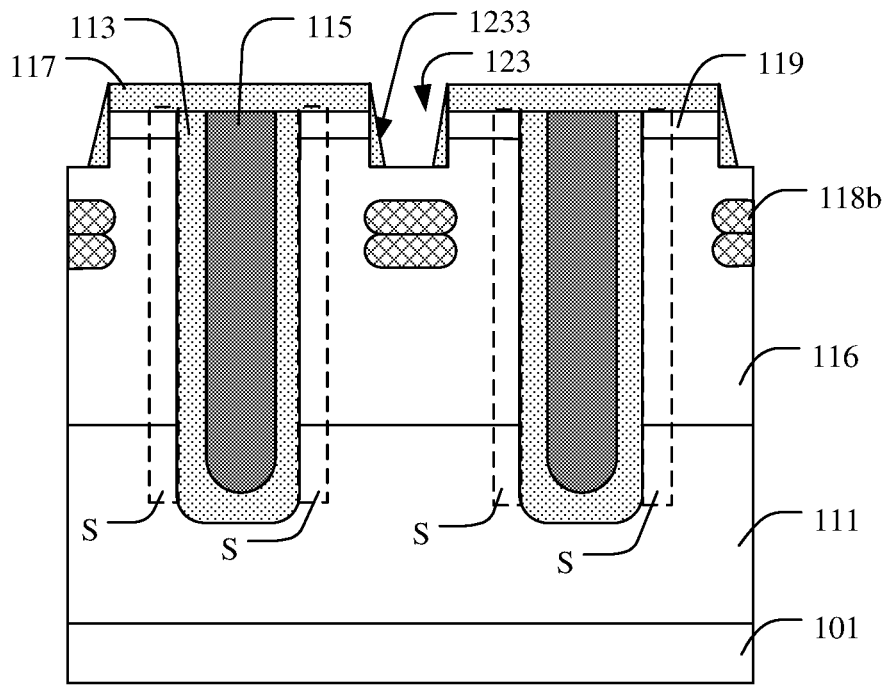
Figure 3M:
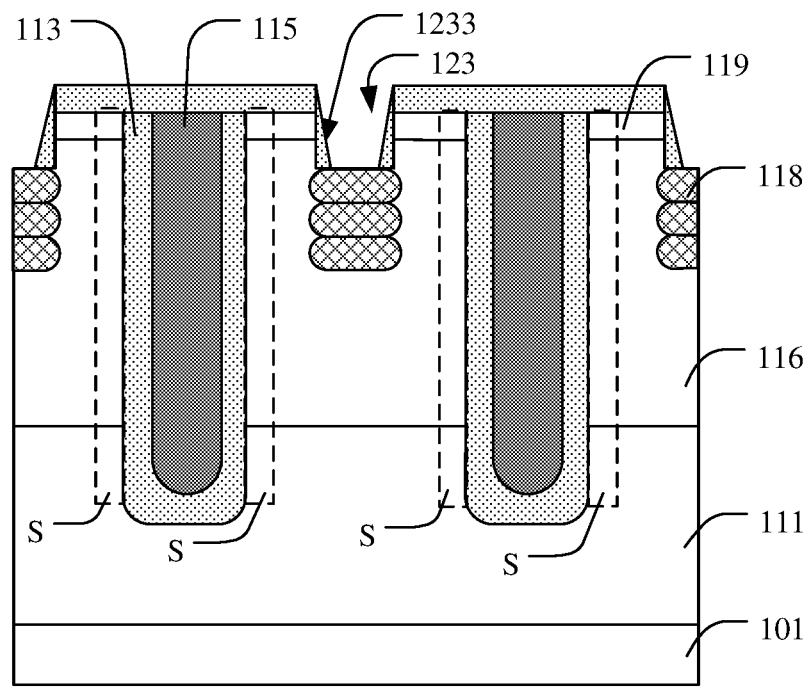
Figure 3N:
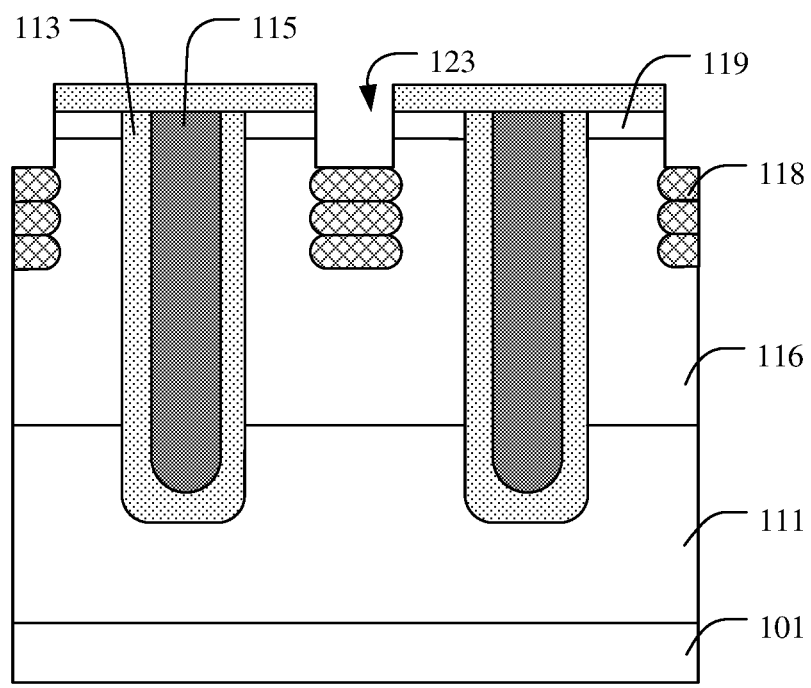
Figure 3O:
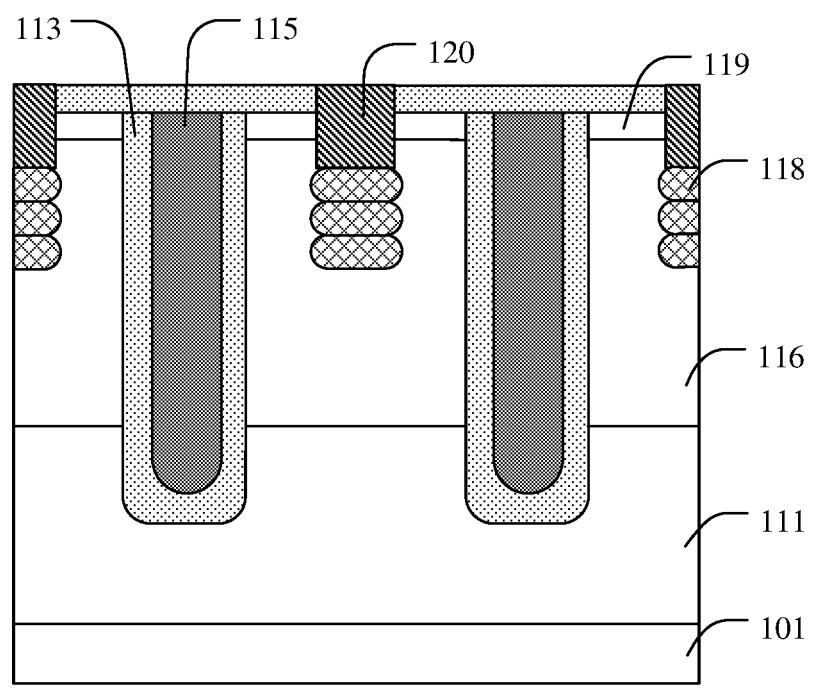

FIG. 3A to FIG. 3O show sectional views of stages of a method for manufacturing a trench MOSFET device according to one or more embodiments of the present application. The method for manufacturing a trench MOSFET device provided in the embodiments of the present application is described below with reference to FIG. 2A to FIG. 2G.

The steps shown in FIG. 3A to FIG. 3G are the same as the steps shown in FIG. 2A to FIG. 2G, and the details are not described herein again.

As shown in FIG. 3H, the second dielectric layer 1172 located at the bottom of the contact hole 123 is removed to form the first spacer 1231.

In the step, the second dielectric layer 1172 is etched by using the dry etching process. By controlling the parameters for the etching, for example, etching energy, an etching angle, and an etching time, the second dielectric layer 1172 covering the side wall of the contact hole 123 is retained when the etching of the second dielectric layer 1172 covering the bottom of the contact hole 123 is completed during the etching of the second dielectric layer 1172 to form the first spacer 1231.

As shown in FIG. 3I, the first ion implantation is performed on the body region 116.

In the step, the first ion implantation is performed with the first ion implantation energy through the contact hole 123 having the first spacer 1231, and a first contact region 118*a* of the second dopant type is formed in the body region 116. During the first ion implantation, the first spacer 1231 located on the side wall of the contact hole 123 blocks lateral implantation of ions, so that the implanted ions mainly extend in a depth direction perpendicular to the contact hole.

As shown in FIG. 3J, the first spacer 1231 is thinned to form a second spacer 1232.

In the step, for example, a part of the first spacer 1231 is removed by wet etching, the first spacer 1231 is thinned, and the rest of the part of the first spacer 1231 forms the second spacer 1232. That is to say, the thickness of the second spacer 1232 is less than the thickness of the first spacer 1231 to form a larger ion implantation window.

As shown in FIG. 3K, the second ion implantation is performed on the body region 116.

The second ion implantation is performed with the second ion implantation energy through the contact hole 123 having the second spacer 1232, and a second contact region 118*b* of the second dopant type is formed in the body region 116. During the second ion implantation, the second spacer 1232 located on the side wall of the contact hole 123 blocks the lateral implantation of the ions. Since the thickness of the second spacer 1232 is less than the thickness of the first spacer 1231, a lateral size of the formed second contact region 118*b* is greater than a lateral size of the first contact region 118*a*.

As shown in FIG. 3L, the second spacer 1232 is thinned to form a third spacer 1233.

In the step, for example, a part of the second spacer 1232 is removed by wet etching, the second spacer 1232 is thinned, and the rest of the part of the second spacer 1232 forms the third spacer 1233. That is to say, the thickness of the third spacer 1233 is less than the thickness of the second spacer 1232 to form a larger ion implantation window. The third spacer 1233 has an inclined side wall. An end of the third spacer 1233 close to the bottom of the contact hole 123 is thicker than an end of the third spacer 1233 close to the opening of the contact hole 123. That is to say, the thickness of the side wall gradually decreases, and an inclined side wall is presented in a direction from the bottom of the contact hole 123 toward the opening of the contact hole 123.

As shown in FIG. 3M, the third ion implantation is performed on the body region 116.

The third ion implantation is performed with the third implantation energy through the contact hole 123 having the third spacer 1233, and a contact region 118 is formed in the body region 116. During the third ion implantation, the third spacer 1233 located on the side wall of the contact hole 123 blocks the lateral implantation of the ions.

Lateral diffusions of a dopant implanted with the first ion implantation energy, a dopant implanted with the second ion implantation energy, and a dopant implanted with the third ion implantation energy vary with distances between the implanted depth and the bottom surface of the contact hole 123. In one or more embodiments, the dopant implanted during the first ion implantation is at a distance from the bottom surface of the contact hole 123 greater than the dopant implanted during the second ion implantation, and the dopant implanted during the second ion implantation is at a distance from the bottom surface of the contact hole 123 greater than the dopant implanted during the third implantation. The first ion implantation energy is greater than the second ion implantation energy, and the second ion implantation energy is greater than the third ion implantation energy. Since the lateral diffusions size at different implantation depths differ, the contact region has a more uniform lateral size by forming spacers and ion implantation windows of different sizes and by performing a plurality of ion implantations through ion implantation windows of different sizes.

As shown in FIG. 3N, the third spacer 1233 is removed.

In the step, for example, the third spacer 1233 is removed by wet etching.

As shown in FIG. 3O, a conductive channel 120 is formed.

In the step, a metal layer is formed by using the deposition process. The metal layer covers the dielectric layer and fills the contact hole 123, and contacts the contact region 118. Then the metal layer on the dielectric layer 117 is removed through back etching or the chemical-mechanical planarization, so that the metal layer only fills the contact hole 123 to form the conductive channel 120. The conductive channel 120 extends to the contact region 118.

A source electrode 122 is formed on the dielectric layer 117 by using the deposition process, the photolithography process, and the etching process. The source electrode 122 is connected to the contact region 118 through the conductive channel 120, and a drain electrode 121 is formed on the second surface of the substrate 101 by using the deposition process, as shown in FIG. 1.

In the present application, the source electrode 122, the gate conductor 115, and the drain electrode 121 may be made of a conductive material. In one or more embodiments, the conductive material may be a metallic material such as an aluminum alloy or copper.

As described above according to the embodiments of the present application, all details of these embodiments are not described in detail and do not limit the present application to being only the specific embodiments. These embodiments are selected and specifically described in this specification to better explain the principles and practical application of the present application, so that those skilled in the art can make good use of and modifications based on the present application.

What is claimed is:

1. A method for manufacturing a trench metal oxide semiconductor field effect transistor (MOSFET), comprising:
    forming a trench extending from an upper surface of an epitaxial layer of a first dopant type into the epitaxial layer;
    forming a gate dielectric layer and a gate conductor located in the trench, wherein the gate dielectric layer covers an inner surface of the trench and isolates the gate conductor from the epitaxial layer;
    forming a body region of a second dopant type located in the epitaxial layer, wherein the body region is adjacent to the trench;
    forming a source region of the first dopant type located in the body region;
    forming a first dielectric layer on the source region and the gate dielectric layer;
    forming a contact hole extending through the first dielectric layer and the source region and extending into the body region;
    forming a spacer on a side wall of the contact hole;
    forming a body contact region of the second dopant type through the contact hole; and
    forming a conductive channel filling the contact hole.

2. The method according to claim 1, wherein a method for forming the contact hole with the spacer comprises:
    forming the contact hole, wherein the contact hole extends into the body region;
    forming a second dielectric layer, wherein the second dielectric layer covers a bottom and a side wall of the contact hole; and
    removing the second dielectric layer at the bottom of the contact hole, and retaining at least part of the second dielectric layer on the side wall of the contact hole, to form the spacer.

3. The method according to claim 2, wherein an end of the spacer close to the bottom of the contact hole is thicker than an end of the spacer close to an opening of the contact hole.

4. The method according to claim 1, wherein the contact region is formed in the body region by performing a single ion implantation on the body region through the contact hole.

5. The method according to claim 1, wherein the contact region is formed in the body region by performing a plurality of ion implantations on the body region through the contact hole.

6. The method according to claim 5, wherein implantation energy for the plurality of ion implantations on the body region through the contact hole gradually decreases.

7. The method according to claim 1, wherein a method for forming the contact hole having the spacer and forming the contact region through the contact hole having the spacer comprises:
    forming the contact hole, wherein the contact hole extends into the body region;
    forming a second dielectric layer, wherein the second dielectric layer covers a bottom and a side wall of the contact hole;
    removing the second dielectric layer at the bottom of the contact hole, and forming a first spacer on the side wall of the contact hole;
    performing a first ion implantation on the body region with a first ion implantation energy through the contact hole having the first spacer;
    thinning the first spacer and forming a second spacer on the side wall of the contact hole; and
    forming the contact region by performing a second ion implantation on the body region with a second ion implantation energy through the contact hole having the second spacer,
    wherein the first ion implantation energy is different from the second ion implantation energy.

8. The method according to claim 7, wherein a thickness of the first spacer is greater than a thickness of the second spacer, and the first ion implantation energy is greater than the second ion implantation energy.

9. The method according to claim 7, further comprising thinning the second spacer and forming a third spacer on the side wall of the contact hole, wherein an end of the third spacer close to the bottom of the contact hole is thicker than an end of the third spacer close to an opening of the contact hole.

10. The method according to claim 9, wherein a position of an implanted dopant during the first ion implantation is at a distance from a bottom surface of the contact hole greater than a position of an implanted dopant during the second ion implantation, the position of the implanted dopant during the second ion implantation is at a distance from the bottom surface of the contact hole greater than a position of an implanted dopant during a third ion implantation, the first ion implantation energy is greater than the second ion implantation energy, and the second ion implantation energy is greater than a third ion implantation energy.

* * * * *